(12) United States Patent
Bouche et al.

(10) Patent No.: US 7,999,366 B2
(45) Date of Patent: Aug. 16, 2011

(54) MICRO-COMPONENT PACKAGING PROCESS AND SET OF MICRO-COMPONENTS RESULTING FROM THIS PROCESS

(75) Inventors: Guillaume Bouche, Grenoble (FR); Bernard Andre, Grenoble (FR); Nicolas Sillon, Fontaine (FR)

(73) Assignee: STMicroelectronics, S.A., Mountrouge (FR)

( * ) Notice: Subject to any disclaimer, the term of this patent is extended or adjusted under 35 U.S.C. 154(b) by 508 days.

(21) Appl. No.: 11/288,942

(22) Filed: Nov. 28, 2005

(65) Prior Publication Data
US 2006/0194364 A1 Aug. 31, 2006

(30) Foreign Application Priority Data

Nov. 26, 2004 (FR) .................................... 04 12570
Nov. 26, 2004 (FR) .................................... 04 12572

(51) Int. Cl.
*H01L 23/02* (2006.01)
(52) U.S. Cl. ........ 257/678; 257/659; 257/660; 257/704; 257/E23.127; 257/E23.128
(58) Field of Classification Search .................. 257/659, 257/660, 704
See application file for complete search history.

(56) References Cited

U.S. PATENT DOCUMENTS

| | | | |
|---|---|---|---|
| 5,577,656 A | 11/1996 | Temple et al. | |
| 5,668,033 A * | 9/1997 | Ohara et al. | 438/113 |
| 5,915,168 A | 6/1999 | Salatino et al. | |
| 6,384,353 B1 * | 5/2002 | Huang et al. | 200/181 |
| 6,429,506 B1 | 8/2002 | Fujii et al. | |
| 6,722,030 B1 | 4/2004 | Stelzl et al. | |
| 6,809,412 B1 | 10/2004 | Tourino et al. | |
| 6,894,358 B2 * | 5/2005 | Leib et al. | 257/414 |
| 6,905,945 B1 * | 6/2005 | Barmatz et al. | 438/455 |
| 7,005,732 B2 * | 2/2006 | Horning et al. | 257/678 |
| 7,015,060 B1 * | 3/2006 | Kubena et al. | 438/50 |
| 7,151,426 B2 * | 12/2006 | Stafford et al. | 335/78 |
| 7,221,033 B2 * | 5/2007 | Lutz et al. | 257/414 |
| 2002/0102004 A1 * | 8/2002 | Minervini | 381/175 |

(Continued)

FOREIGN PATENT DOCUMENTS

EP 1 346 949 A 9/2003

(Continued)

OTHER PUBLICATIONS

Mescheder U M et al.; "Local Laser Bonding for Low Temperature Budget", Sensors and Actuators A, Elsevier Sequoia S.A., Lausanne, CH, vol. 97-98, Apr. 1, 2002, pp. 422-427, XP004361631.

(Continued)

*Primary Examiner* — Angel Roman
(74) *Attorney, Agent, or Firm* — Lisa K. Jorgenson; Kevin D. Jablonski; Graybeal Jackson

(57) ABSTRACT

A process for packaging a plurality of micro-components made on the same substrate wafer, in which each micro-component is enclosed in a cavity. This process includes making a cover plate; depositing a metal layer on a face of the cover plate or on a face of the wafer; covering the wafer with the cover plate; applying a contact pressure equal to at least one bar onto the cover plate and onto the wafer; and heating the metal layer during pressing until a seal is obtained, each cavity thus being provided with a sealing area and being closed by a part of the cover plate and/or its metal layer.

5 Claims, 2 Drawing Sheets

U.S. PATENT DOCUMENTS

2002/0168797 A1    11/2002   DiStefano et al.
2003/0179057 A1*   9/2003    Shen et al. .................... 335/78
2004/0028849 A1    2/2004    Stark et al.
2004/0067604 A1*   4/2004    Ouellet et al. ............... 438/108
2004/0087043 A1*   5/2004    Lee et al. ...................... 438/6
2004/0188821 A1*   9/2004    Chen et al. ................... 257/688
2004/0207059 A1*   10/2004   Hong ........................... 257/678
2005/0141240 A1    6/2005    Hata et al.
2008/0252988 A1    10/2008   Tormen et al.

FOREIGN PATENT DOCUMENTS

WO    WO 03/084861 A    10/2003

OTHER PUBLICATIONS

French Search Report for FR 0412572 dated Jul. 12, 2005.
French Search Report for FR 0412570 dated Jul. 11, 2005.

* cited by examiner

MICRO-COMPONENT PACKAGING PROCESS AND SET OF MICRO-COMPONENTS RESULTING FROM THIS PROCESS

PRIORITY CLAIM

This application claims priority from French patent application Nos. 04 12572, filed Nov. 26, 2004, and 04 12570, filed Nov. 26, 2004, which are incorporated herein by reference.

CROSS REFERENCE TO RELATED APPLICATION

This application is related to U.S. patent application Ser. No. 11/289,776 entitled PROCESS FOR PACKAGING MICRO-COMPONENTS USING A MATRIX, which has a common filing date and owner and which is incorporated by reference.

TECHNICAL FIELD

An embodiment of the invention relates generally to packaging techniques in general for micro-electronic components.

More precisely, a first embodiment of the invention relates to a process for packaging a plurality of micro-components such as micro-electromechanical systems made on the same substrate wafer, this process comprising an operation of enclosing each micro-component in a cavity surrounded by at least two walls, the first wall of which is composed of the substrate.

BACKGROUND

Despite many manufacturing techniques developed in micro-electronics, packaging of micro-components and particularly micro-electromechanical systems is still a relatively long, complex and expensive operation.

SUMMARY

An embodiment of the invention is a packaging process free from some of the defects present in the prior art processes.

To achieve this, the process according to an embodiment of the invention comprises a preparatory operation that includes making a cover plate sized to simultaneously cover several micro-components or all micro-components on the wafer and depositing a metal layer on a lower face of the cover plate and/or an upper face of the wafer, a covering operation including covering the wafer with the cover plate, the lower face of the cover plate then forming a contact interface with the upper face of the wafer through the metal layer(s), a pressing operation including applying a contact pressure onto the cover plate and the wafer equal to at least one bar, and a sealing operation concomitant with the pressing operation including heating the metal layer(s) at the contact interface at least in a plurality of areas forming the sealing areas until a seal is obtained, each cavity being provided with at least one sealing area, and the second wall of each cavity being composed of at least part of the cover plate and/or its metal layer, and in that the sealing operation is applied by irradiating the metal layer or each metal layer in the contact interface by electromagnetic radiation absorbed by this metal layer, and through at least one layer transparent to this radiation, this transparent layer being composed of at least the wafer or the cover plate.

The positioning adjectives such as "lower" and "upper" should be interpreted in a relative manner and within a spatial coordinate system chosen freely with respect to the ground coordinate system.

In this case, the electromagnetic radiation may for example be composed of a light beam in the infrared range. In the infrared range, this radiation could be generated by an Nd YAG laser.

This electromagnetic radiation may be applied sequentially or in parallel over an entire face of the transparent layer, each micro-component being protected from electromagnetic radiation by a heat shield arranged on a face of the transparent layer.

To achieve this, it is possible for the lower face of the cover plate to be fully covered by a metal layer, each cavity thus being covered by an area of this metal layer, for the cover plate to be used as a transparent layer, and for the heat shield of each cavity to comprise at least the area of the metal layer that covers this cavity.

This operating mode may be applied equally well in the case in which each cavity is formed in the substrate wafer and in the case in which each cavity is formed in the cover plate.

However, it is also possible for each cavity to be formed in the substrate wafer, for the cover plate to be used as a transparent layer and for the heat shield of each cavity to comprise a layer opaque to the electromagnetic radiation deposited on the upper face of the cover plate above this cavity.

It is also possible for each cavity to be formed in the substrate wafer, for the wafer to be used as a transparent layer and for the heat shield of each cavity to comprise a layer opaque to the electromagnetic radiation deposited on the lower face of the wafer vertically in line with this cavity.

Regardless of the specific arrangement chosen, it may be advantageous if the cover plate is made from a polymer material or a glass material, and preferably glass with a low coefficient of expansion such as borosilicate glass.

This cover plate may also be made using a polymer replication or hot-stamping technique.

For example, the metal includes or contains gold or it includes or contains nickel, and the substrate includes or contains silicon.

Each cavity may be fully surrounded by its sealing area.

The packaging process as defined above may be completed by a cutting operation subsequent to the sealing operation, including separating micro-components on the same wafer from each other, each micro-component remaining encapsulated in its cavity.

An embodiment of the invention also relates to a set of micro-components such as micro-electromechanical systems made by the use of a process like that described above.

BRIEF DESCRIPTION OF THE DRAWINGS

Other characteristics and advantages of embodiments of the invention will become clear from the description given below for information and that is in no way limitative, with reference to the attached drawings in which.

DETAILED DESCRIPTION

Figure 1:
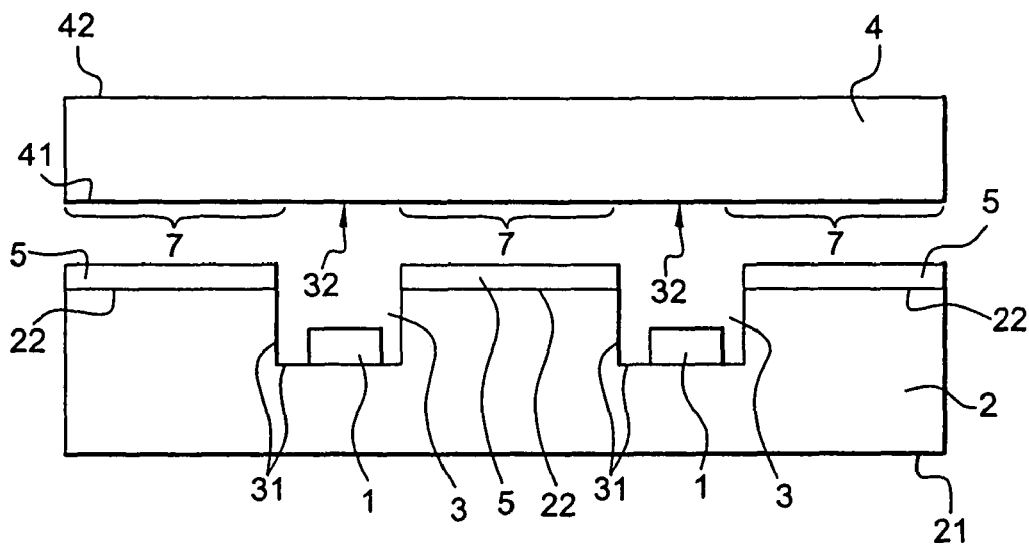
FIG. 1 is a partial enlarged and diagrammatic sectional view of a substrate wafer and a cover plate prepared for sealing according to a first embodiment of the invention.

As already mentioned, an embodiment of the invention relates particularly to a process for packaging a plurality of micro-components 1, and particularly micro-electromechanical systems previously made on the same substrate wafer or disk 2, for example made of silicon or another semiconducting material.

An end purpose of this process is to enclose each micro-component 1 in a cavity 3 surrounded by several walls such as 31 and 32, in which the first wall 31 is composed of the substrate 2.

To achieve this, the process according to the embodiment of the invention includes firstly a preparatory operation that includes making a cover plate 4 and depositing at least one metal layer 5, for example gold.

The cover plate 4 is sized to simultaneously cover several micro-components 1 on the wafer 2 and preferably even all micro-components 1 on the same wafer.

Although the cover plate 4 may be made of silicon or any other semiconducting material, it may also be made of a polymer material or glass, such as a glass with a low coefficient of expansion such as borosilicate glass.

This plate 4 can thus be made using a polymer or hot stamping replication technique.

In the polymer replication technique, also known by the term "nano-imprint", a form, for example a glass or silicon wafer, is sculpted according to a three-dimensional profile, for example by ionic machining. This form is covered by a metal plate, for example made of nickel, that is pressed in contact with the sculpted surface, to make a negative of this surface. The metal plate thus formed is used as a mold for a polymer resin injected onto this plate under pressure and heated on contact with it. The result is thus a polymer replica of the initially sculpted surface. This operation, which can be applied many times without degradation to the mold, is known for its application in pressing of audio compact disks (CDs).

In the hot-stamping technique, also known as "hot-embossing", a form creating a negative is initially made on a substrate, for example made of silicon or a refractory material. This surface is then formed by pressing in contact with a disk made of or covered by polymer. This technique can be used to form materials with a higher melting point such as metals or glass.

The metal layer 5, which may be composed particularly of gold, nickel or a metal alloy, is deposited on the lower face 41 of the cover plate 4 and/or on the upper face 22 of the wafer 2, the terms "lower" and "upper" being understood in this context for a given arbitrary orientation in space corresponding to the drawings.

The process according to this embodiment of the invention then includes a covering operation that includes covering the wafer 2 with the cover plate 4.

At the end of this operation, the lower face 41 of the cover plate 4 thus forms a contact interface 6 (FIGS. 4 and 5) through the metal layer(s) 5 with the upper face 22 of the wafer 2.

The process according to this embodiment of the invention then includes a pressing operation that includes applying a mutual contact pressure equal to at least one bar, and typically between 1 bar and 5 bars, on the cover plate 4 and on the wafer 2.

The process according to this embodiment of the invention also includes a sealing operation concomitant with the pressing operation and that includes heating the metal layer(s) 5 at the contact interface 6 at least at a plurality of areas 7 which, after this operation, form sealing areas, until a seal is obtained.

The heating temperature typically reaches 400° C. locally, in other words a temperature greater than the temperature of the gold-silicon eutectic in the case in which the metal layer 5 is at least partially composed of gold and in which the substrate 2 and the cover plate 4 are composed of silicon.

However, different and particularly higher temperatures could be used if other metals or alloys or other materials are used for the substrate and/or the cover plate 4.

Sealing is done such that each cavity 3 has at least one sealing area 7 adjacent to it.

At the end of the sealing operation, the second wall 32 of each cavity 3 is composed of a part of the cover plate 4 and/or its metal layer 5.

In another embodiment of the invention, the sealing operation is applied by irradiating the metal layer 5 or each metal layer 5 of the contact interface 6 by electromagnetic radiation EMR that can be absorbed by this metal layer 5.

To achieve this, irradiation is done through a layer transparent to the EMR radiation used, this transparent layer being composed either of the cover plate 4 (FIG. 4), or the wafer 2 (FIG. 5) or possibly by both at the same time provided that the cover plate 4 and the wafer 2 are both transparent to the EMR radiation used.

The electromagnetic radiation EMR may be composed of a light beam in the infrared range, for example a beam with a wavelength of 1064 nm produced by a pulsed or continuous Nd YAG laser.

The electromagnetic radiation EMR may be applied in the form of a selectively directed beam by relative movement of this beam and the wafer 2, directed on areas to be heated that will become the sealing areas 7.

This technique may be advantageous particularly in the case illustrated in FIG. 1, in which the micro-components 1 are not protected against EMR radiation and could be damaged by a non-selective application of this radiation over the entire surface of the wafer 2 or the cover plate 4.

However, it is also possible for electromagnetic radiation to be applied sequentially or in parallel over the entire surface of the transparent layer, and to protect each micro-component 1 from the electromagnetic radiation EMR by an EMR, e.g., heat, shield 8 arranged on a face of the transparent layer, in other words either on a face of the wafer 2, or on a face of the cover plate 4, or on both.

Figure 2:
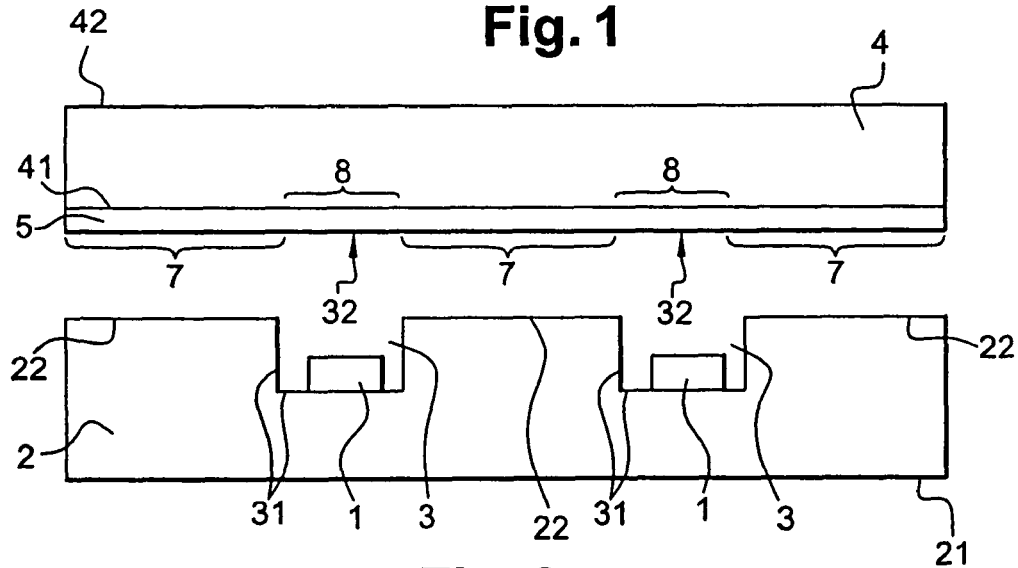
FIG. 2 is a partial enlarged and diagrammatic sectional view of a substrate wafer and a cover plate prepared for sealing according to a second embodiment of the invention.
Figure 3:
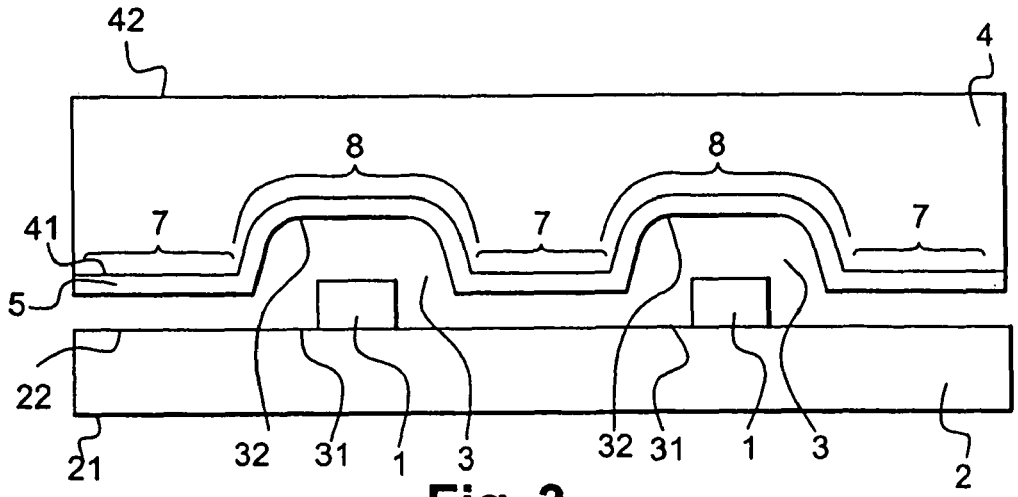
FIG. 3 is a partial enlarged and diagrammatic sectional view of a substrate wafer and a cover plate prepared for sealing according to a third embodiment of the invention.

As shown in FIGS. 2 and 3, which illustrate arrangements in which the cover plate 4 is used as a transparent layer, the lower face 41 of the cover plate 4 may also be fully covered by a metal layer 5.

Thus, each cavity 3 is covered by an area of this metal layer 5, and the heat shield 8 of each cavity 3 is formed at least by the area of the metal layer 5 that covers this cavity 3.

This protection mode may be used equally well in the case illustrated in FIG. 2 in which each cavity 3 is formed in the substrate wafer 2, and in the case illustrated in FIG. 3 in which each cavity 3 is formed in the cover plate 4.

Figure 4:
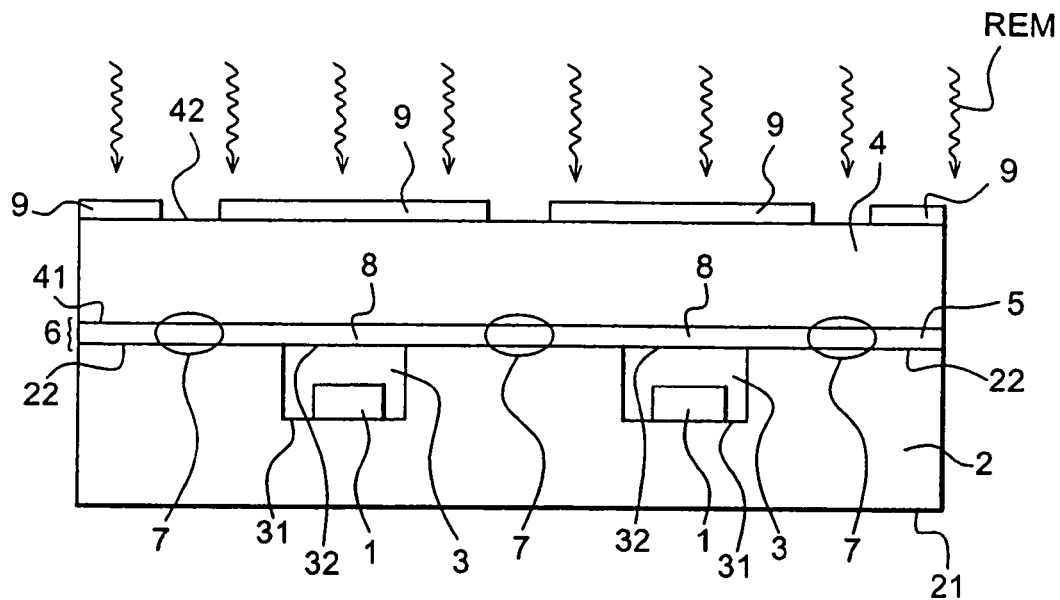
FIG. 4 is a partial enlarged and diagrammatic sectional view of a substrate wafer and a cover plate, during sealing according to a fourth embodiment of the invention.

Nevertheless, in the case in which each cavity 3 is formed in the substrate wafer 2 and in which the cover plate 4 is used as a transparent layer, it is also possible as shown in FIG. 4 for the heat shield of each cavity 3 to also include a layer 9 opaque to electromagnetic radiation, for example a metallic layer, deposited on the upper face 42 of the cover plate 4 above this cavity 3.

Figure 5:
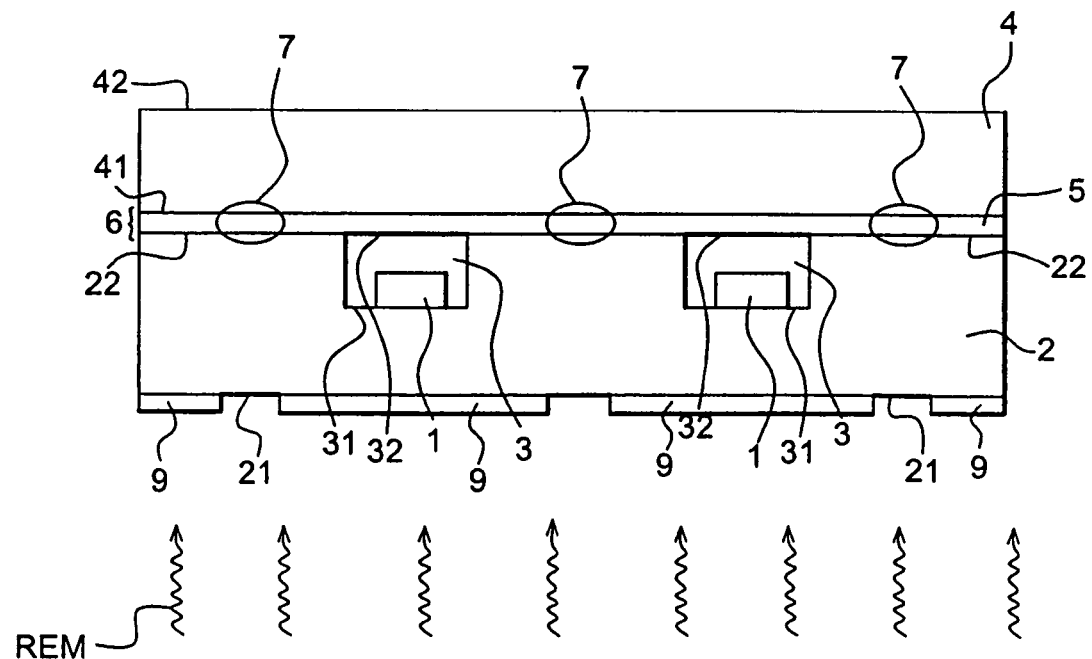
FIG. 5 is a partial enlarged and diagrammatic sectional view of a substrate wafer and a cover plate, during sealing according to a fifth embodiment of the invention.

In the case in which each cavity 3 is formed in the substrate wafer 2 and in which the substrate wafer 2 is used as a transparent layer, it is possible as shown in FIG. 5 for the heat shield of each cavity 3 to include a layer 9 opaque to electromagnetic radiation, for example a metallic layer, and deposited on the lower face 21 of the wafer 2 vertically in line with this cavity 3.

To achieve relatively good protection of each micro-component 1, it is useful for the sealing area 7 associated with each cavity 3 to fully surround the cavity and thus makes it sealed.

After sealing, the process according to an embodiment of the invention includes a cutting operation that includes separating the micro-components 1 on the same wafer 2 from each other by cutting out the wafer 2 and the plate 4 all around each cavity 3, each micro-component 1 thus remaining encapsulated in its cavity 3.

The described embodiments of the invention also relate to any set of micro-components such as micro-electromechanical systems 1 made using a process like that described above. Such a set of micro-components may be part of an integrated circuit or system.

From the foregoing it will be appreciated that, although specific embodiments of the invention have been described herein for purposes of illustration, various modifications may be made without deviating from the spirit and scope of the invention.

What is claimed is:

1. A structure, comprising:
   a substrate;
   a heat shield disposed over a portion of the substrate and formed at least by the area of at least one metal layer;
   a cover plate disposed over the substrate and the heat shield;
   a cavity having a first wall formed by the substrate and having a second wall formed by the cover plate; and
   a micro electromechanical component disposed under the heat shield in the cavity that is protected from electromagnetic radiation by the heat shield, wherein a portion of the substrate not aligned with the micro electromechanical component is exposed to electromagnetic radiation.

2. The structure of claim 1, further comprising a layer of metal disposed between the substrate and the cover plate.

3. The structure of claim 1 wherein the cavity has fourth, fifth, and sixth walls formed by the substrate.

4. An integrated circuit, comprising:
   a substrate;
   a cover plate disposed over the substrate;
   a cavity having a first wall formed by the substrate and having a second wall formed by the cover plate;
   a micro electromechanical component disposed in the cavity; and
   a heat shield disposed over the micro electromechanical component and under the cover plate, and formed at least by the area of at least one metal layer to prevent electromagnetic radiation from irradiating the substrate aligned with the micro electromechanical component.

5. A system, comprising:
   a structure including,
      a substrate;
      a cover plate disposed over the substrate;
      a cavity having a first wall formed by the substrate and having a second wall formed by the cover plate;
      a micro electromechanical component disposed in the cavity; and
      a radiation shield disposed over the micro electromechanical component and under the cover plate, and having at least one hole disposed over a portion of the substrate not aligned with the electromechanical component.

* * * * *